United States Patent
Tsuneta et al.

(10) Patent No.: US 8,993,961 B2
(45) Date of Patent: Mar. 31, 2015

(54) ELECTRIC CHARGED PARTICLE BEAM MICROSCOPE AND ELECTRIC CHARGED PARTICLE BEAM MICROSCOPY

(75) Inventors: Ruriko Tsuneta, Fuchu (JP); Hideki Kikuchi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 427 days.

(21) Appl. No.: 13/522,132

(22) PCT Filed: Jan. 21, 2011

(86) PCT No.: PCT/JP2011/000299
§ 371 (c)(1),
(2), (4) Date: Jul. 13, 2012

(87) PCT Pub. No.: WO2011/089911
PCT Pub. Date: Jul. 28, 2011

(65) Prior Publication Data
US 2012/0287258 A1    Nov. 15, 2012

(30) Foreign Application Priority Data
Jan. 25, 2010  (JP) .................. 2010-012748

(51) Int. Cl.
*H01J 37/28*  (2006.01)
*H01J 37/26*  (2006.01)

(52) U.S. Cl.
CPC ............... *H01J 37/28* (2013.01); *H01J 37/265* (2013.01); *H01J 2237/221* (2013.01); *H01J 2237/2809* (2013.01)
USPC ............................ 250/306; 250/307; 250/310

(58) Field of Classification Search
USPC .......................................... 250/306, 307, 310
See application file for complete search history.

(56) References Cited

U.S. PATENT DOCUMENTS

2003/0111602 A1    6/2003  Sato et al.
2012/0235036 A1*   9/2012  Hatakeyama et al. ........ 250/310

FOREIGN PATENT DOCUMENTS

| JP | 07-272665 A   | 10/1995 |
| JP | 2002-015692 A | 1/2002 |
| JP | 2002-222633 A | 8/2002 |
| JP | 2003-086126 A | 3/2003 |

(Continued)

OTHER PUBLICATIONS

Cizmar et al.; "Real-Time Image Composition with Correction of Drift Distortion"; National Institute of Standards and Technology; Oct. 2009; pp. 1-9.

*Primary Examiner* — Kiet T Nguyen
(74) *Attorney, Agent, or Firm* — Mattingly & Malur, P.C.

(57) ABSTRACT

The electric charged particle beam microscope includes an electric charged particle source; a condenser lens converging electric charged particles emitted from the electric charged particle source on a specimen; a deflector scanning the converged electric charged particles over the specimen; a control unit of the deflector; a specimen stage on which the specimen is mounted; a detector detecting the electric charged particles; a computer forming an image from a control signal from the deflector and an output signal from the detector; and a display part connected with the computer. The control unit of the deflector can change the scan rate of the electric charged particles. A first rate scan image is obtained at a first rate and a second rate scan image is obtained at a second rate slower than the first rate.

10 Claims, 13 Drawing Sheets

(56) References Cited

FOREIGN PATENT DOCUMENTS

| JP | 2007-200784 A | 8/2007 |
| JP | 2007-220529 A | 8/2007 |
| JP | 2007-298397 A | 11/2007 |
| JP | 2007-299768 A | 11/2007 |
| WO | 03/044821 A1 | 5/2003 |
| WO | 2011/007492 A1 | 1/2011 |

* cited by examiner

THE LOCUS OF A SPECIMEN DRIFT

BLURRED IMAGE DUE TO SPECIMEN DRIFT

DISTORTED IMAGE DUE TO SPECIMEN DRIFT

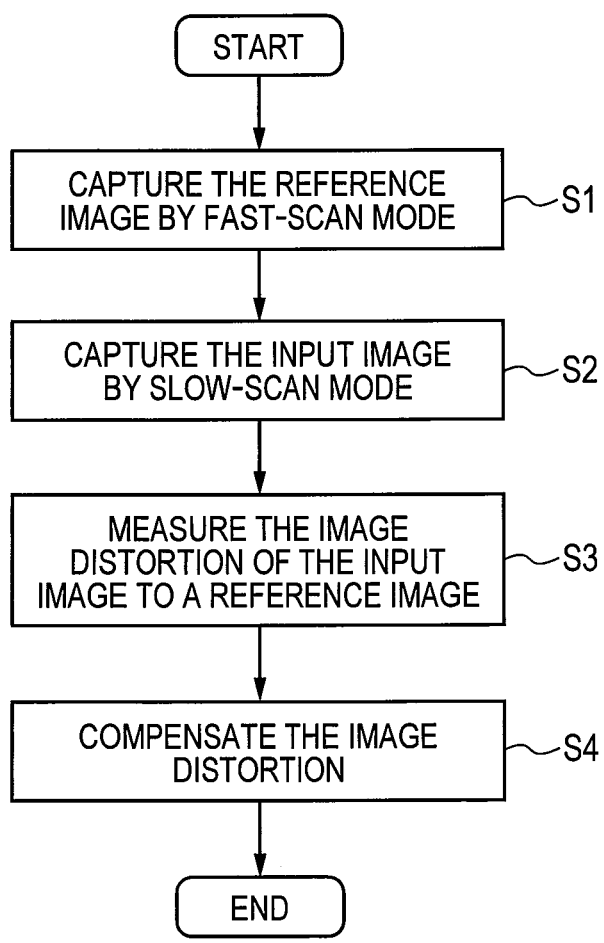

INPUT IMAGE

ELECTRIC CHARGED PARTICLE BEAM MICROSCOPE AND ELECTRIC CHARGED PARTICLE BEAM MICROSCOPY

TECHNICAL FIELD

The present invention relates to an electric charged particle beam microscope and electric charged particle beam microscopy.

BACKGROUND ART

In semiconductor device development and nano-material development, electric charged particle beam microscopes and electric charged particle beam microscopy capable of analyzing specimen structure at a spatial resolution power of an order of nanometer (nm) are essential. The electric charged particle beam microscopes are categorized into various types according to the beams to be used. One of these microscopes is a scanning transmission electron microscope (STEM) that scans over a specimen with a converged narrow electron beam and detects electron beams that have been transmitted through the specimen to form an image, and another is a scanning electron microscope (SEM) that detects secondary electrons and backscattered electrons to form an image. Ion microscopes using ions as incident beams are also a type of electric charged particle beam microscopes. One of the major features of these microscopes is their high resolution power, which is a point to consider for microscope development. Specimen drift is an inhibiting factor in achieving high resolution. Specimen drift may cause blurring and distortion in formed images. Whether an image becomes blurred or distorted depends on the imaging modes. A fast-scan mode rapidly scans beams to capture a plurality of image frames and then integrates the image frames to form an image to be stored, while a slow-scan mode forms an image to be stored by a single slow scanning operation. In the fast-scan mode, specimen drift causes image shifts between the frames. The integrated image shifts result in a stored image having blurring in the drift direction. If there is an original image as shown in FIG. 2A and specimen drift occurs, the image undergoes blurring in areas indicated by a hatch pattern in FIG. 2B. On the other hand, the specimen drift occurring during the slow-scan mode operation causes image distortion in the drift direction (FIG. 2C).

The techniques below are a result of surveys on techniques to reduce specimen drift effect. PTL 1 discloses a drift compensation technique of SEM. In Embodiment 1 of PTL 1, a plurality of multi-frame integrated images are taken by the fast-scan mode and then the multi-frame integrated images are integrated while the image shifts between the images are compensated for in order to obtain a target image less affected by the drift through the fast-scan mode.

PTL 2 discloses a technique for making it possible to compensate for various types of image shift caused by drift occurring during imaging. In PTL 2, SEM images are taken within a short period of time before and while a characteristic X-ray image is being obtained, and the plurality of SEM images are divided into a plurality of small domains, respectively. The amounts and directions of shifts between the small domains are calculated and represented by two-dimensional vectors to obtain not only the shift caused by translation of images for compensation during imaging of the characteristic X-ray image, but also components, such as scaling, rotation and trapezoidal distortion, to adjust the driving amount of a specimen stage or the control amount of a deflector coil.

Since scanning distortion caused by electronic circuitry is one of the factors that distort electric charged particle beam images, techniques for reducing the effect of the scanning distortion also have been surveyed.

PTL 3 discloses a method for correcting a TV scan image I2, which is distorted in the scanning direction due to scanning errors made while the TV scan image is scanned at a high scan rate, by using a slow scan image I1, which is taken at a low scan rate and therefore has ignorable scanning errors.

CITATION LIST

Patent Literature

PTL 1: Japanese Unexamined Patent Application Publication No. 2007-299768
PTL 2: Japanese Unexamined Patent Application Publication No. 2007-298397
PTL 3: Japanese Unexamined Patent Application Publication No. 2007-220529

SUMMARY OF INVENTION

Technical Problem

The present invention has an object to provide an electric charged particle beam microscope and electric charged particle beam microscopy capable of reducing the effect of specimen drift on images even for high-resolution, high-SNR imaging. A considered example is an image with a pixel size of 0.2 nm and an image size of 1280×960 pixels formed in 20 seconds. It is assumed that an average specimen drift caused by stress relief of stage components (O-ring, etc.) and temperature variations owing to electron beam irradiation is 1.5 nm/min. (0.025 nm/sec). This means that the specimen has drifted 0.5 nm, equivalent to 2.5 pixels, during imaging, and therefore compensation for the specimen drift must be made. However, it has been found that the inventions disclosed in the aforementioned patent literature cannot sufficiently correct the blurring in the fast-scan images and the distortions in the slow-scan images even if the specimen drift compensation techniques are applied to high resolution and high SNR imaging.

The present invention has been made to provide an electric charged particle beam microscope and electric charged particle beam microscopy capable of reducing the effect of specimen drift on images even for high-resolution, high-SNR imaging.

Solution to Problem

The fast-scan images are blurred due to specimen drift, but have minimum distortion. On the other hand, the slow-scan images are distorted due to specimen drift, but have minimum blurring. Focusing on the facts, it has been found that an electric charged particle beam image that has a high resolution and high SNR and is not affected or less affected by specimen drift can be provided by capturing the same field of view by the fast-scan mode at a low SNR and low resolution and by the slow-scan mode at a high SNR and high resolution and measuring distortion in the slow-scan image with respect to the fast-scan image as a reference image and compensating for the distortion.

Specifically, the present invention is directed to an electric charged particle beam microscope including: an electric charged particle source; a condenser lens converging electric charged particles emitted from the electric charged particle source on a specimen; a deflector deflecting the converged electric charged particles to scan the specimen; a control unit of the deflector; a specimen stage on which the specimen is mounted; a detector detecting the electric charged particles; a computer forming an image from a control signal from the deflector and an output signal from the detector; and a display part connected with the computer. The control unit of the deflector can change the scan rate of the electric charged particles. A first rate scan image is obtained at a first rate and a second rate scan image is obtained at a second rate slower than the first rate. The electric charged particle beam microscope includes an analysis unit measuring the distortion of the second rate scan image by using the first rate scan image and compensating for the distortion.

In addition, the analysis unit of the electric charged particle beam microscope divides the first rate scan image and the second rate scan image into small domains, respectively. The analysis unit measures image shift amounts between the small domains of the first rate scan image and the small domains of the second rate scan image by pattern matching. The analysis unit determines the image distortion from the distribution of the image shift amounts.

In addition, the analysis unit of the electric charged particle beam microscope divides the first rate scan image and the second rate scan image into small domains, respectively. The analysis unit measures image shift amounts and correlative values between the small domains of the first rate scan image and the small domains of the second rate scan image by pattern matching. The analysis unit omits the image shift amount whose correlative value is equal to or lower than a threshold. The omitted image shift amount is interpolated based on image shift amounts of small domains in the neighborhood of the small domain whose image shift amount is omitted.

Furthermore, the present invention is directed to an electric charged particle beam microscope including: an electric charged particle source; a condenser lens converging electric charged particles emitted from the electric charged particle source on a specimen; a deflector scanning the converged electric charged particles over the specimen; a control unit of the deflector; a specimen stage on which the specimen is mounted; a detector detecting the electric charged particles; a computer forming an image from a control signal from the deflector and an output signal from the detector; and a display part connected with the computer. The control unit of the deflector can change the scan rate of the electric charged particles. A first rate scan image is obtained at a first rate and a second rate scan image is obtained at a second rate slower than the first rate. The display part displays the image distortion of the second rate scan image obtained by using the first rate scan image.

In addition, the electric charged particle beam microscope is characterized in that it can be determined whether the image distortion of the second rate scan image needs to be compensated for or not based on the image distortion.

In addition, the electric charged particle beam microscope includes an analysis unit measuring and compensating for the image distortion. The analysis unit divides the first rate scan image and the second rate scan image into small domains, respectively. The analysis unit measures image shift amounts between the small domains of the first rate scan image and the small domains of the second rate scan image by pattern matching. The analysis unit determines the distortion from the image distribution of the image shift amounts.

In addition, the electric charged particle beam microscope includes an analysis unit measuring and compensating for the image distortion. The analysis unit divides the first rate scan image and the second rate scan image into small domains, respectively. The analysis unit measures image shift amounts and correlative values between the small domains of the first rate scan image and the small domains of the second rate scan image by pattern matching. The analysis unit omits the image shift amount whose correlative value is equal to or lower than a threshold. The omitted image shift amount is interpolated based on image shift amounts of small domains in the neighborhood of the small domain whose image shift amount is omitted.

Furthermore, the present invention is directed to electric charged particle beam microscopy that scans electric charged particles over a specimen and forms an image based on a secondary signal emitted from the specimen. The microscopy includes: a first step of scanning the specimen at a first rate to form an image; a second step of scanning the specimen at a rate slower than the first rate to form an image; a third step of measuring distortion of the second rate scan image by using the first rate scan image; and a fourth step of compensating for the distortion of the second rate scan image based on the measured distortion.

In addition, the third step of the electric charged particle beam microscopy includes: a step of dividing the first rate scan image and the second rate scan image into small domains, respectively; a step of measuring image shift amounts between the small domains of the first rate scan image and the small domains of the second rate scan image by pattern matching; and a step of determining the image distortion from the distribution of the image shift amounts.

In addition, the third step of the electric charged particle beam microscopy includes: a step of dividing the first rate scan image and the second rate scan image into small domains, respectively; a step of measuring image shift amounts and correlative values between the small domains of the first rate scan image and the small domains of the second rate scan image by pattern matching; a step of omitting the image shift amount whose correlative value is equal to or lower than a threshold; and a step of interpolating the omitted image shift amount based on image shift amounts of small domains in the neighborhood of the small domain whose image shift amount is omitted.

Advantageous Effects of Invention

The present invention can provide an electric charged particle beam microscope and electric charged particle beam microscopy capable of reducing the effect of specimen drift on images even for high-resolution, high-SNR imaging.

BRIEF DESCRIPTION OF DRAWINGS

FIG. 3 is a flow chart of the basic system operation for automatically compensating for image distortion caused by specimen drift.

DESCRIPTION OF EMBODIMENTS

Images of the same field of view are captured by a fast-scan mode at low SNR and low resolution and by a slow-scan mode at high SNR and high resolution, and the distortion of the slow-scan image is measured with respect to the fast-scan image as a reference image and compensated. This technique can provide an electric charged particle beam image that is unaffected or extremely less affected by specimen drift even for high-power, high-resolution and high-SNR imaging. In other words, an electric charged particle beam microscope, including a scanning electron microscope and ion microscope, is provided.

In recent years, STEMs/SEMs have been increasingly used for not qualitative morphological observation, but for quantitative analysis. In STEM/SEM image analysis, such as three-dimensional reconstruction conducted with a series of rotation STEM images and cross-section dimension control and defect detection of a semiconductor device using multiple STEM/SEM images, even a few distorted pixels greatly affect the analysis results. The present invention is made to drastically improve the analytic performance. The present invention can also compensate for non-linear specimen drift occurring immediately after a stop of a specimen stage at high precision, thereby eliminating the wait time until the specimen drift speed steadies. Therefore, the present invention significantly increases operation efficiency of the iterative process of stage movement and imaging as required for the series of rotation STEM imaging for three-dimensional reconstruction and STEM/SEM imaging for the cross-section dimension control and defect detection of a semiconductor device.

The following describes some embodiments.

Embodiment 1

Embodiment 1 shows a STEM to which a system for automatically compensating for image distortion caused by specimen drift is applied.

Figure 7:
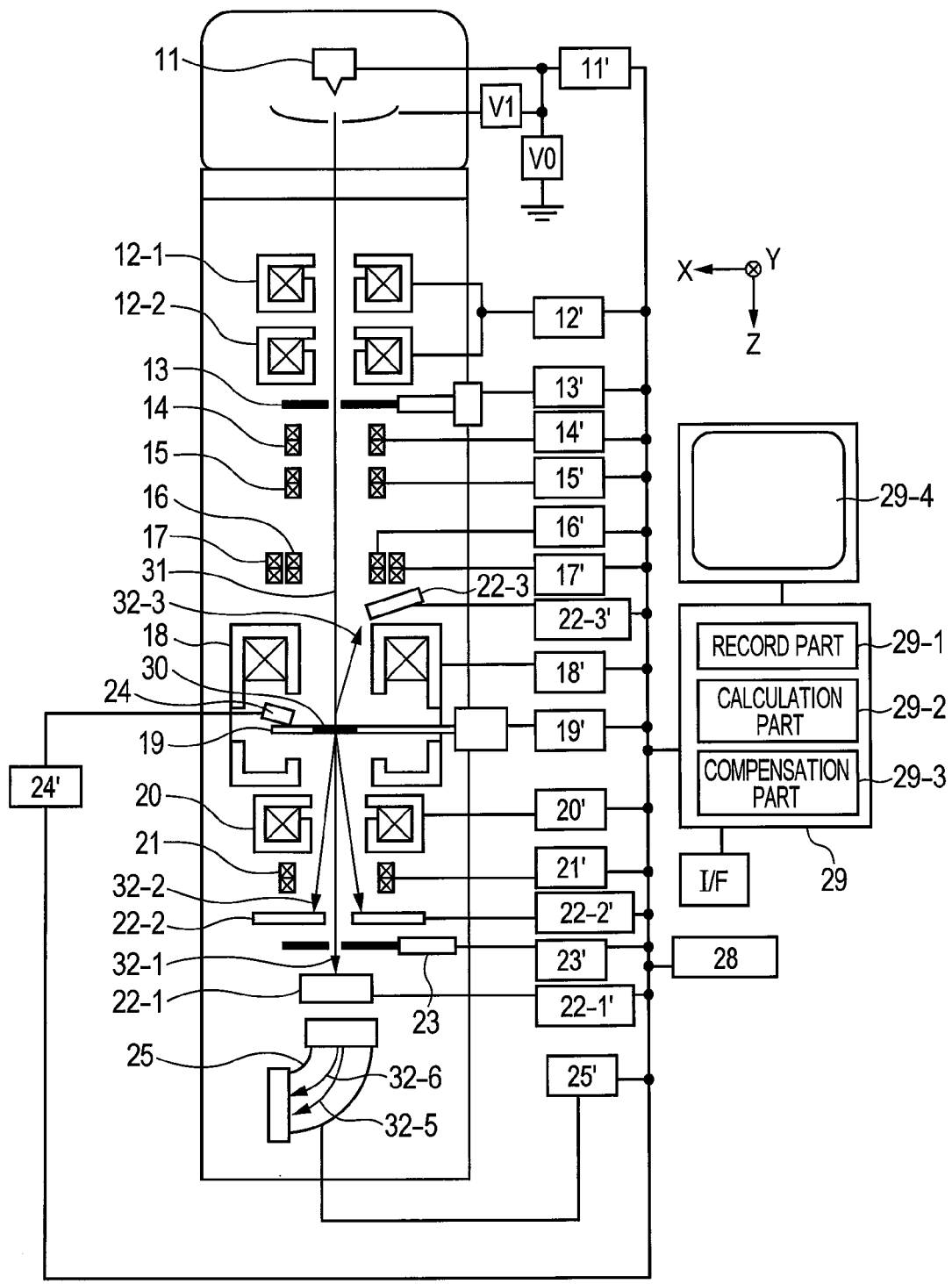
FIG. 7 is a schematic view of a basic configuration of a STEM/SEM.

FIG. 7 shows a basic configuration of the STEM/SEM used in Embodiment 1. A direction substantially parallel to the optical axis of the optical column is assumed to be the Z direction and a plane substantially orthogonal to the optical axis is assumed to be the XY plane. The STEM/SEM system includes an electron gun 11, which is an electric charged particle source, for emitting a primary electron beam 31, an electron gun control unit 11', condenser lenses 12-1, 12-2 for converging the primary electron beam 31 emitted from the electron gun, a condenser lens control unit 12', a condenser aperture 13 for controlling the divergent angle of the primary electron beam 31, a condenser aperture control unit 13', an alignment deflector 14 for controlling the incidence angle of the beam to a specimen 30, an alignment deflector control unit 14', a stigmator 15 for correcting the shape of the primary electron beam 31 incident on the specimen 30, a stigmator control unit 15', an image shift deflector 16 for adjusting the irradiation area of the primary electron beam 31 incident on the specimen 30, an image shift deflector control unit 16', a scanning deflector 17 for raster-scanning the primary electron beam 31 over the specimen 30, a scanning deflector control unit 17', an objective lens 18 for adjusting the focal position of the primary electron beam 31 on the specimen 30, an objective lens control unit 18', a specimen stage 19 for determining the position and rotation angle of the specimen 30 to the primary electron beam 31, a specimen stage control unit 19', an electron detector 22 for detecting an electron beam 32 emitted from the specimen 30, an electron detector control unit, a projective lens 20 for projecting the electron beam 32 onto the electron detector 22, a projective lens control unit 20', a deflector 21 for deflecting the electron beam 32, a deflector control unit 21', an aperture 23 for controlling the divergent angle of the electron beam 32, an aperture control unit 23', a vision unit 28 for forming a STEM/SEM image from an output signal from the electron detector and a raster-scan signal, and a computer 29 with control program and image processing program installed. The computer 29 includes a recording section 29-1 for recording a plurality of images, a calculating section 29-2 for measuring the distortion between images, a compensating section 29-3 for forming a compensated image from an input image based on the measured distortion, and a display part 29-4 which displays the images, calculation results and compensation results. The individual control units and the vision unit are controlled by commands from the computer 29.

Arranged in the STEM/SEM are a plurality of electron detectors 22 including an electron detector for bright-field images 22-1 for detecting low angle scattering electrons out of electron beams emitted forward from the specimen 30, an electron detector for dark-field images 22-2 for detecting high angle scattering electrons out of electron beams emitted forward from the specimen 30, and a detector 22-3 for detecting backscattered electrons and secondary electrons emitted backward from the specimen 30. An image formed by electrons emitted forward from the specimen 30 is called a STEM image, while an image formed by electrons emitted backward from the specimen 30 is called a SEM image. In addition, a transmitted electron beam can be split into an elastically scattered electron beam 32-5 and an inelastically scattered electron beam 32-6 by an electron energy-loss spectroscope 25 and an electron energy-loss spectroscope control unit 25' to measure the split beams. An X-ray generated from the specimen can be measured by an energy-dispersive X-ray spectroscope 24 and an energy-dispersive X-ray spectroscope control unit 24'. The energy-dispersive X-ray spectroscope 24 and electron energy-loss spectroscope 25 can analyze the composition of the specimen and chemical bond state of the specimen.

Embodiment 1 provides an example where the drift compensation system is used to form a STEM image; however, the system is applicable to other types of signal images.

FIG. 3 shows a basic operation flow of the system for compensating for distortion caused by specimen drift with the STEM.

The specimen drift distortion compensating system performs through step 1 for storing a reference image formed by a fast-scan mode at a first rate, step 2 for storing an input image formed by a slow-scan mode at a second rate slower than the first rate, step 3 for measuring distortion of the input image based on the reference image, and step 4 for compensating for the distortion of the input image. Following is an example of assumed imaging conditions. Given that an average specimen drift caused by stress relief of stage components (O-ring, etc.) and temperature variations owing to electron beam irradiation is 1.5 nm/min. (0.025 nm/sec.), and an image to be stored has 0.2 nm in pixel size and 1280×960 pixels in number and are obtained in an imaging time of 20 seconds. Details of each step will be described below.

In step 1, a reference image is formed by a fast-scan mode. One fast-scan frame is captured in 0.04 seconds. The amount of specimen drift occurring during formation of a frame is approximately 1 pm, or 0.005 pixels, therefore the frame can be regarded as an image without distortion. However, since specimen drift causes each frame to have a different field of view, summing up the fast-scan frames results in a blurred image. In short, the fast-scan image is blurred, but less distorted. If the number of summed frames is too few, the accuracy of image processing is degraded due to the low SNR. If the number of summed frames is too many, the accuracy of image processing is degraded due to image blurring caused by specimen drift. The appropriate number of frames to be summed is approximately 8 or 16. It is estimated that the drift amount occurring while 16 frames (1.28 sec.) are summed up is approximately 0.032 nm (0.16 pixels).

In step 2, an input image is formed by a slow-scan mode. Since the slow-scan mode does not require summing images, the formed image is not blurred by specimen drift, but distorted by gradual shift of the position where the electron beam enters. The image to be stored is formed under the imaging conditions: the pixel size is 0.2 nm; the pixel number is 1280×960; and the imaging time is 20 seconds, and the resultant image is distorted because the field of view shifts approximately 0.5 nm, or 2.5 pixels, during imaging. Measurement of distortion caused by specimen drift requires the reference image and input image to cover roughly the same field of view. In other words, the reference image and input image having different resolutions, but covering the same field of view enable the measurement of distortion. This is because the resolution can be adjusted during image processing. Setting the fast-scan image to have a low resolution, for example, 640×480 pixels and 0.4 nm in pixel size, can enhance the speed of image saving and image processing. Even if the sequence of step 1 and step 2 is changed, the distortion measurement can be implemented.

Figure 4:
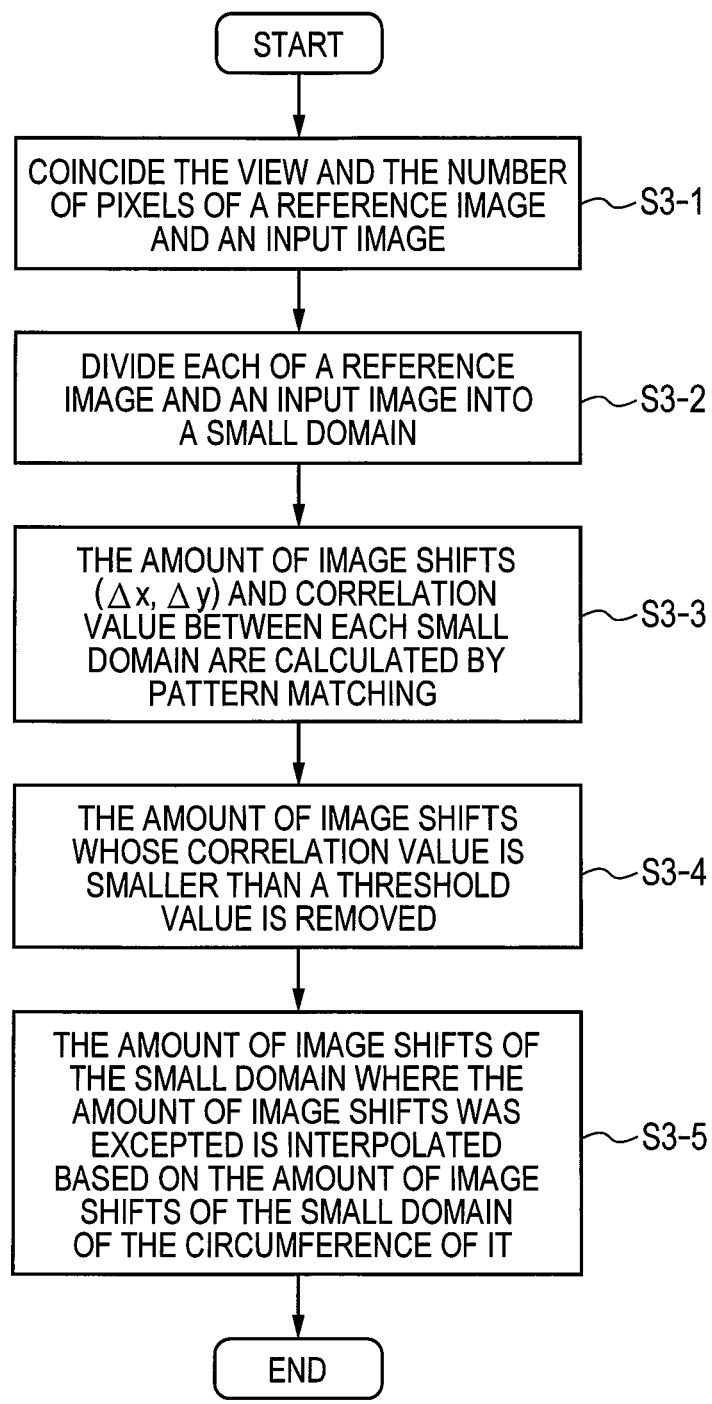
FIG. 4 is a flow chart of steps (in step 3 of the basic operation flow) for measuring the distortion of an input image with respect to a reference image.
Figure 5A:
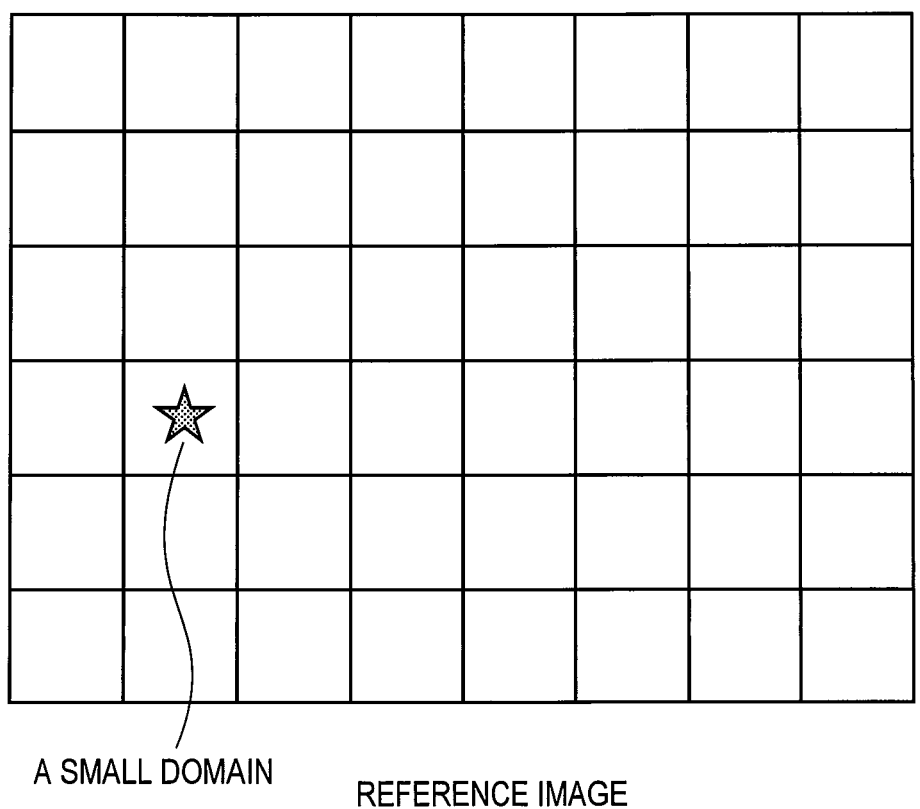
FIG. 5A shows a reference image to illustrate distortion measurement by small-domain matching.
Figure 5B:
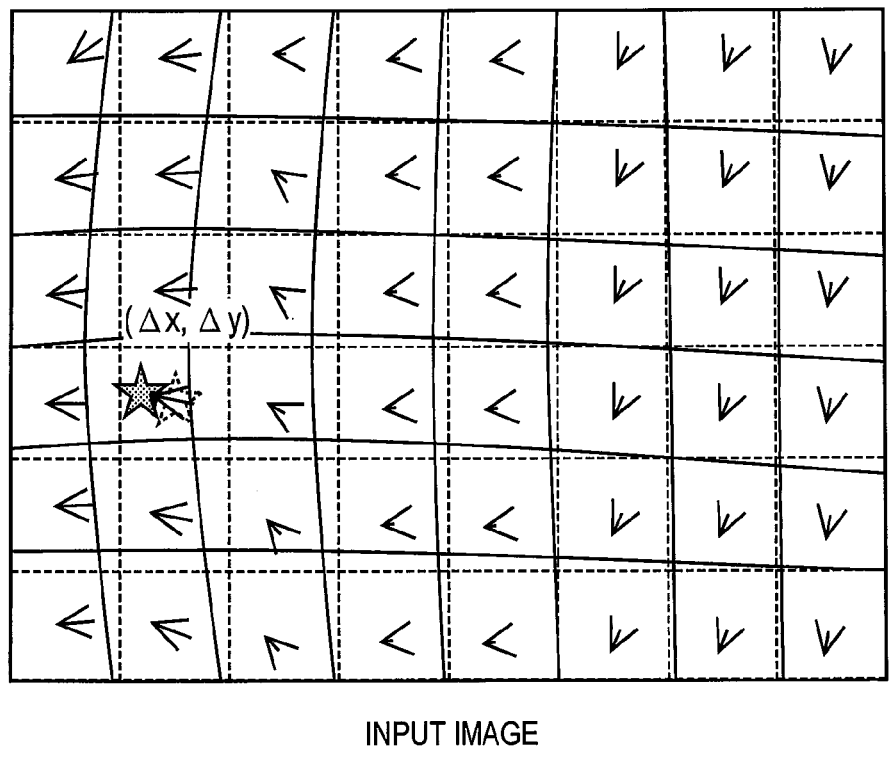
FIG. 5B shows an input image to illustrate distortion measurement by small-domain matching.

In step 3, distortion of the slow-scan image with respect to the fast-scan image is measured. FIG. 4 shows the measurement flow. First, the field of view and pixel size of the fast-scan image and slow-scan image are adjusted to be the same (S3-1). In this description, both images are adjusted to have 640×480 pixels. Then, the entire images are brought into alignment with each other. Subsequently, the reference image and input image are divided into small domains (S3-2), respectively, and the image shift amounts ($\Delta x$, $\Delta y$) and the correlative values between the small domains are determined by pattern matching (S3-3) to record the values as image distortion measurement results (See FIG. 5). A normalized cross-correlation method or phase-only correlation method is used as the pattern matching. Representing the image shift amounts by arrows helps users readily recognize them. However, the users cannot recognize the arrows represented in the actual size of the image shift amounts ($\Delta x$, $\Delta y$), because the image shifts amount are as small as a few pixels. Therefore, arrows extended about 10 folds in length may be easier for the users to recognize the image shift amounts. Some small domains may not include any feature point required for image processing depending on the field of view the images have. In this case, pattern matching cannot be used to obtain the image shift amounts. The feasibility of pattern matching is determined based on the correlative value between images. If the correlative value is lower than a threshold, it is determined that pattern matching is not effective and the image shift amount is omitted from the calculation of the distortion compensation value (S3-4). Even if the correlative value is equal to or higher than the threshold, a wrong image shift amount may be sometimes detected, and therefore, extremely large image shift amounts compared with other measurement results are omitted. The omitted image shift amounts are interpolated based on image shift amounts in the neighborhood of the omitted image shift amounts to create the distortion compensation values (S3-5).

Figure 6:
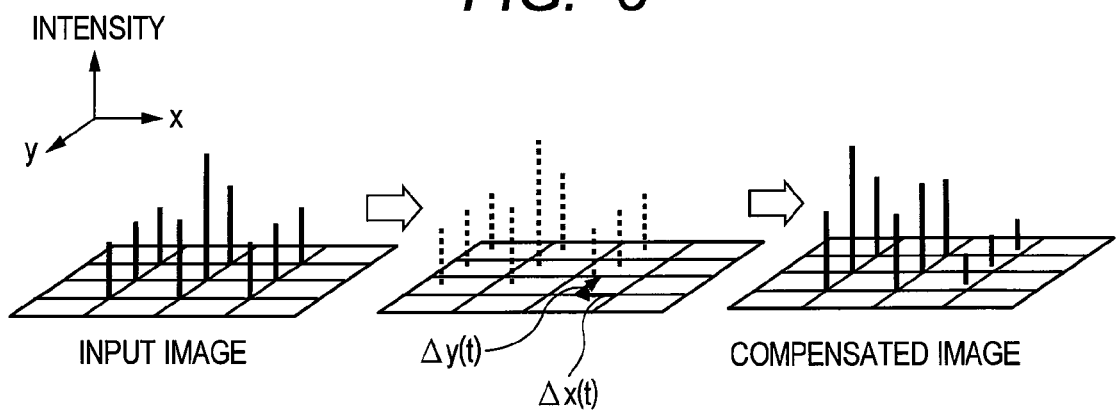
FIG. 6 illustrates a method for forming a compensated image from an input image based on a distortion compensation value.

In step 4, distortion is compensated for. A method for forming a compensated image from an input image by using a distortion compensation value will be described with reference to FIG. 6. The input image is a discrete image in which the intensity I (xn, yn) is assigned to each pixel. Note that xn and yn are integers. Since the distortion compensation value ($\Delta x$, $\Delta y$) of each pixel is a real number, a compensated image is formed by assigning I (xn, yn) to the pixels in the vicinity of ($\Delta x$, $\Delta y$).

It is not absolutely necessary, but adding a step for making sure that appropriate compensation has been made by measuring the distortion amount of the compensated image with respect to the reference image is effective. The present invention also includes a function of displaying an error message in order to urge the users to change image processing conditions when the distortion amount of the compensated image with respect to the reference image is equal or higher than a preset distortion amount threshold.

Figure 1:
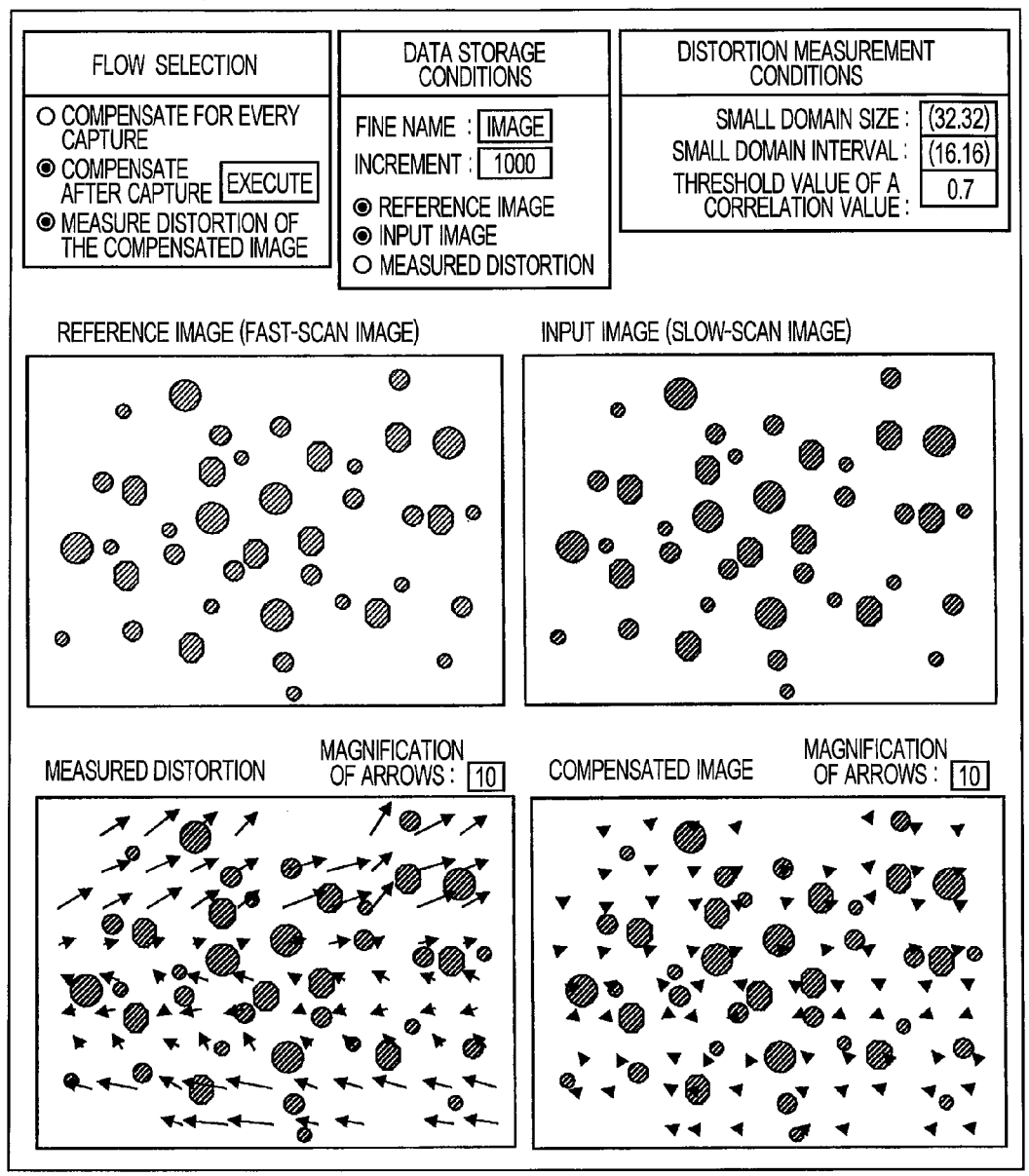
FIG. 1 illustrates one example of settings and a display screen of a system for automatically compensating for image distortion caused by specimen drift.
Figure 2A:
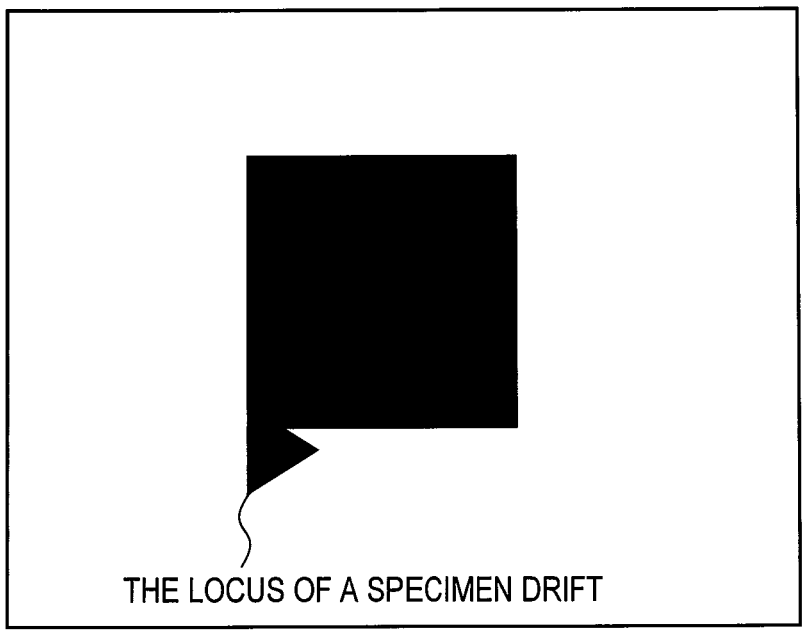
FIG. 2A shows an original image to illustrate image blur and image distortion caused by specimen drift.
Figure 2B:
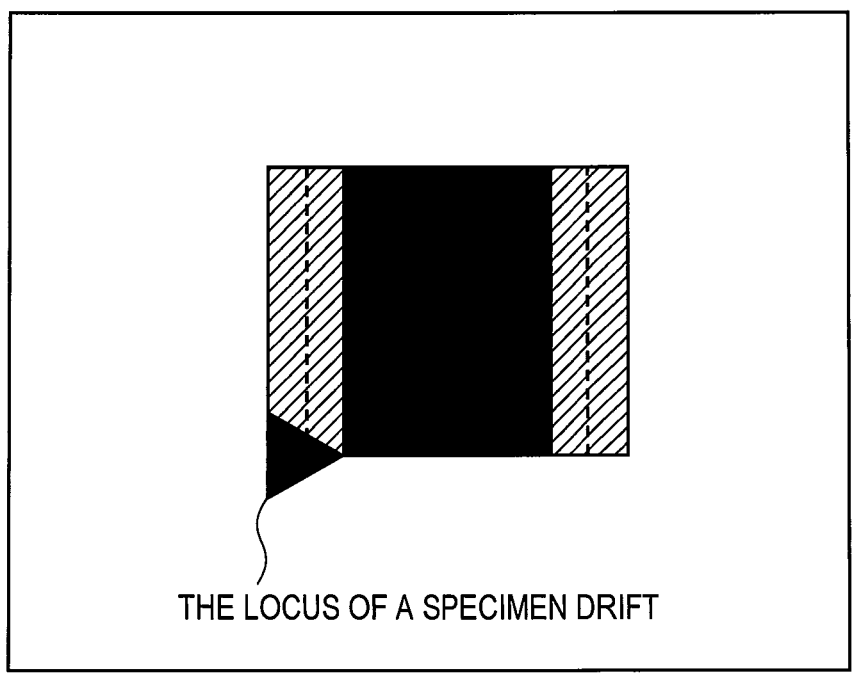
FIG. 2B shows a blurred image to illustrate image blur and image distortion caused by specimen drift.
Figure 2C:
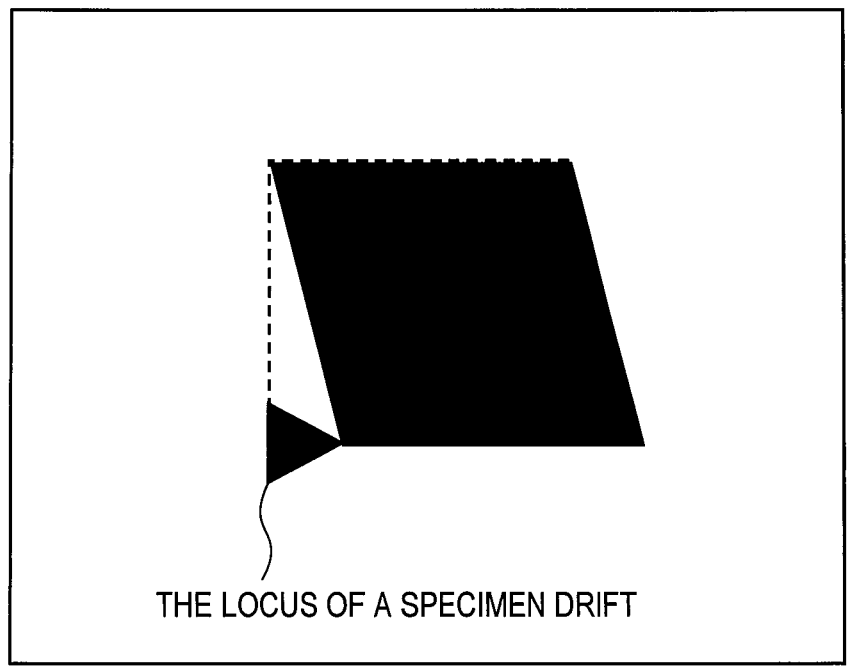
FIG. 2C shows a distorted image to illustrate image blur and image distortion caused by specimen drift.

At last, a screen that displays the aforementioned system control settings and processing results is shown in FIG. 1. The window for flow control contains checkboxes to select whether to measure and compensate for image distortion every time after capturing an image, whether to measure and compensate for image distortion only after capturing necessary images, and whether to measure the distortion of compensated images. The user cannot choose both the checkbox for compensation for every image and the checkbox for compensation for the necessary image at the same time. If the user checks none of the checkboxes, the distortion compensation will not be carried out.

Among users who choose to compensate for distortion of every image, some users need to store the compensated image, but do not need to store the reference image, input image and distortion measurement results. For such users, provided is a window for inputting data storage conditions. If the checkboxes for storing the reference image, input image and distortion measurement results are unchecked, the data of these images and results is not stored. Checking the checkbox for compensation for the necessary image brings the checkboxes for storing the reference image and input image presented in the data storage conditions into a checked state, and only the reference image and input image are stored when the images are captured. The name of the stored file is made up with a main file name and a sub file name to indicate the type of data. The file name can be renamed by an automatic updating function. After inputting a convenient numeric value in the "Increment" box, the numeric value is incremented by 1 every time after an image is captured and the incremented numeric value is added to the file name. Given that the main file name is "Image" and a numeric "1000" is input in the Increment box, the reference image is named "Image1000R", the input image is named "Image1000I", the distortion measurement result is named "Image1000D", and the compensated image is named "Image1000C". If the Increment box is blank, a window (not shown) requesting input of a file name appears every time after an image is captured. To execute compensation after necessary images are captured, the user clicks the "Execute" button provided on the right of the checkbox for compensation to show a window (not shown) requesting input of the file name. Upon specifying the main name of the file to be compensated, processing starts on only the file with the main name. Upon specifying a folder name, images in the folder are to be processed in sequence. The screen has image display areas for the reference image, input image, distortion measurement results and the compensated image. Displaying the input image on the background of the area for the distortion measurement results makes it easy for the user to check which domain cannot be used for block matching. If the checkbox for measuring the distortion of the compensated image is checked, the distortion of the compensated image with respect to the reference image is measured and the distortion measurement results are displayed over the compensated image. The distortion measurement results are indicated by arrows (Δx, Δy) each having a base point at the center of the small domain. Many of the distortions represented by (Δx, Δy) measure about 1 pixel, which is too small for the user to recognize the arrows if the arrows are represented at actual scale. Thus, the arrows can be rescaled. Changeable distortion measurement conditions are the size of the small domains, the distance between the small domains and the threshold of the correlative value. The user checks the distortion measurement results and then changes the conditions if needed.

Users can be registered as a general user or an administrator. In this case, it is preferable to set the distortion condition settings to appear only on screens dedicated for the administrator, but not on screens for general users in order to prevent beginner-level users from inputting inappropriate parameters and making improper drift compensation. Alternatively, it is also preferable that the general users just retrieve a specified recipe created by the administrator. For example, a CT imaging process with a series of rotation images and a device-dimension measurement process by a STEM both require multiple high-magnification images, but capture images with different types of specimen holders through different specimen stage movement steps. Therefore, the administrator adjusts the parameters for the specimen drift compensation system according to the conditions of the processes and stores the parameters as a recipe so that the general user can retrieve the recipe whenever needed.

Embodiment 2

In Embodiment 2, as with the case of Embodiment 1, the apparatus shown in FIG. 7 measures specimen drift before forming images, forms an image while compensating for the specimen drift by an image shift deflector 16, and executes distortion compensation after forming the image through the image processing described in Embodiment 1. The matters that are described in Embodiment 1, but not in Embodiment 2, should be considered as being included in Embodiment 2.

Figure 8:
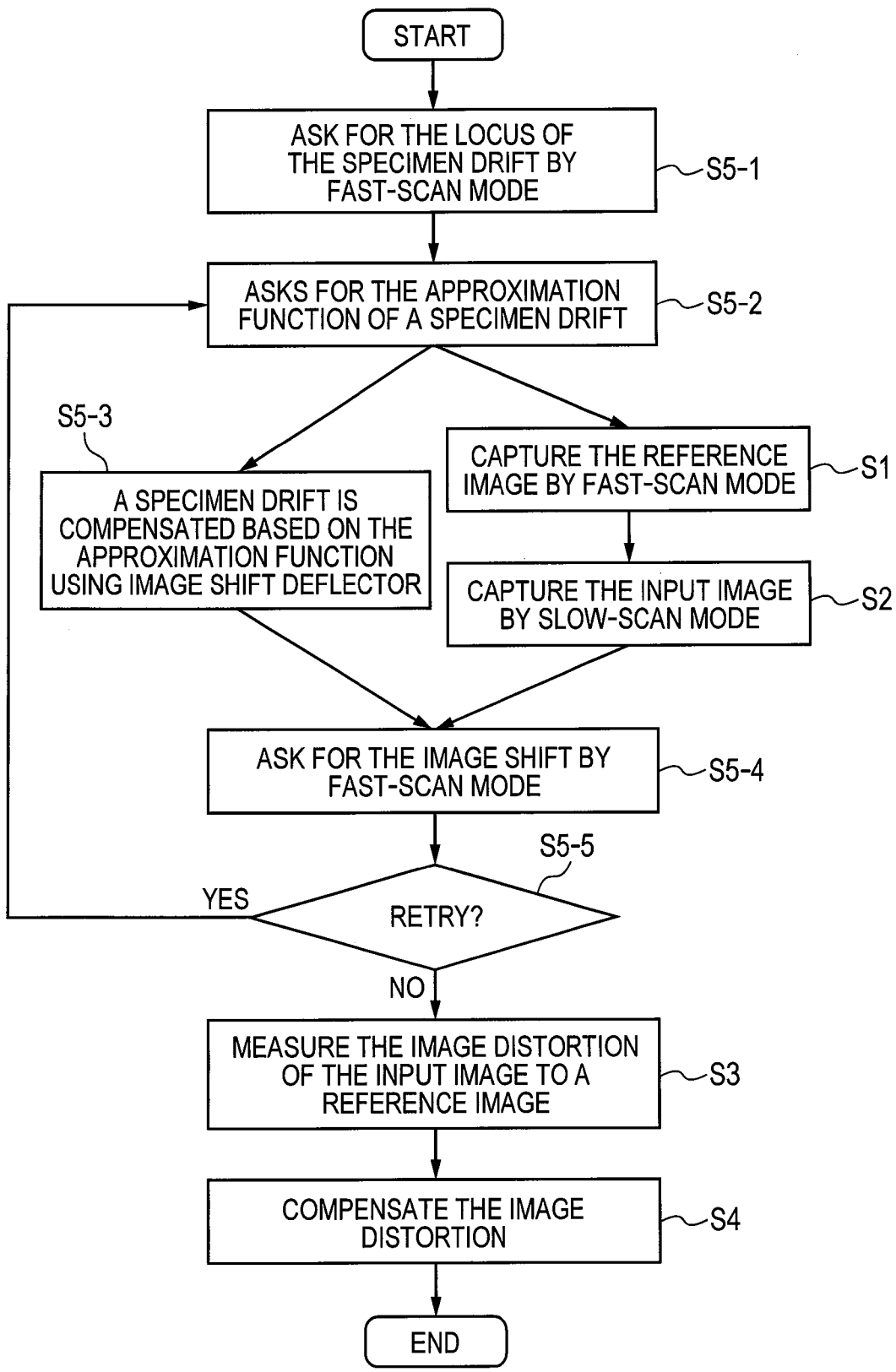
FIG. 8 is a flow chart of the operation of a system, which is used in Embodiment 2, for automatically compensating for image distortion caused by specimen drift.

FIG. 8 shows a flow of compensating for specimen drift in Embodiment 2. Steps (S5) for compensating for specimen drift by an image shift deflector during imaging are added to the basic flow shown in FIG. 3.

First, specimen drift is measured by using fast-scan images (S5-1), and an approximation function of the specimen drift occurred during imaging is determined (S5-2). In Embodiment 2, the number of images to be captured is set to 3 or more, and the approximation function of the specimen drift is obtained from the plurality of measurement results of image shift. While the drift amount during imaging is equivalent to a few pixels, the error in the image shift measurement is approximately 0.1 to 0.5 pixels. An error of 10% or higher is not negligible. To reduce the error, the hypothesis is introduced that the specimen drift is smooth transition of the specimen. The locus of the specimen drift includes high frequency components that are regarded as an error in the image shift measurement. Random errors are reduced by fitting the locus of the specimen drift in a low order function, such as a first-degree polynomial and second-degree polynomial. A reference image is captured by a fast-scan mode (S1), while the specimen drift is compensated for by controlling the image shift deflector (S5-3) based on the approximation function obtained in (S5-2), and an input image is captured by a slow-scan mode (S2). After the images are captured, an image for measuring the drift is captured (S5-4). If the approximation function of the specimen drift greatly deviates from the actual locus, the images can be captured again (S5-5). When it is determined that imaging has completed, distortion of the input image with respect to the reference image is measured (S3) and then is compensated for (S4). If the specimen stage or specimen holder is equipped with a piezo-mechanism, the specimen drift during imaging can be compensated for by the piezo-mechanism.

Figure 9:
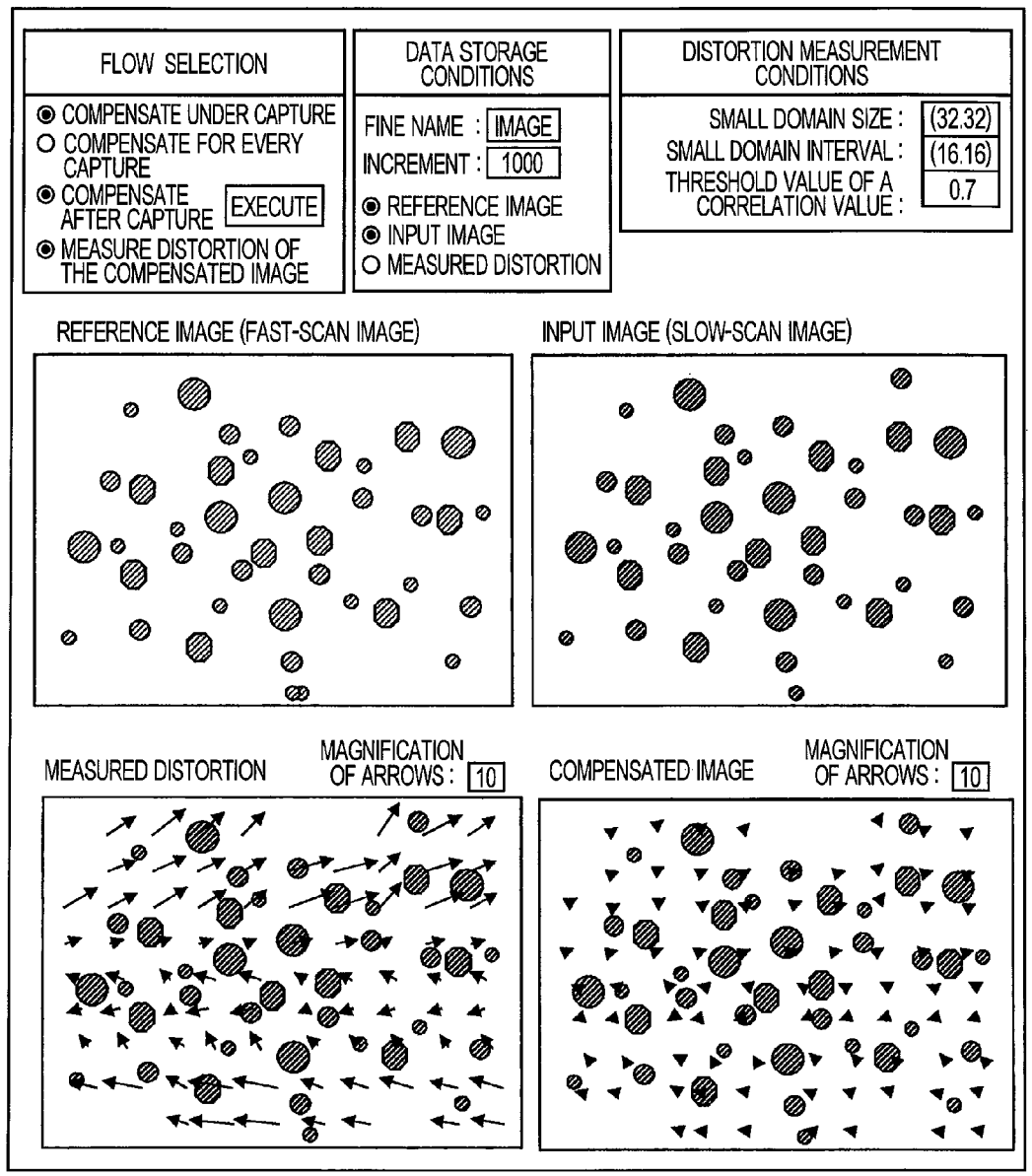
FIG. 9 illustrates an example of the settings and a display screen of the system, which is used in Embodiment 2, for automatically compensating for image distortion caused by specimen drift.
Figure 10:
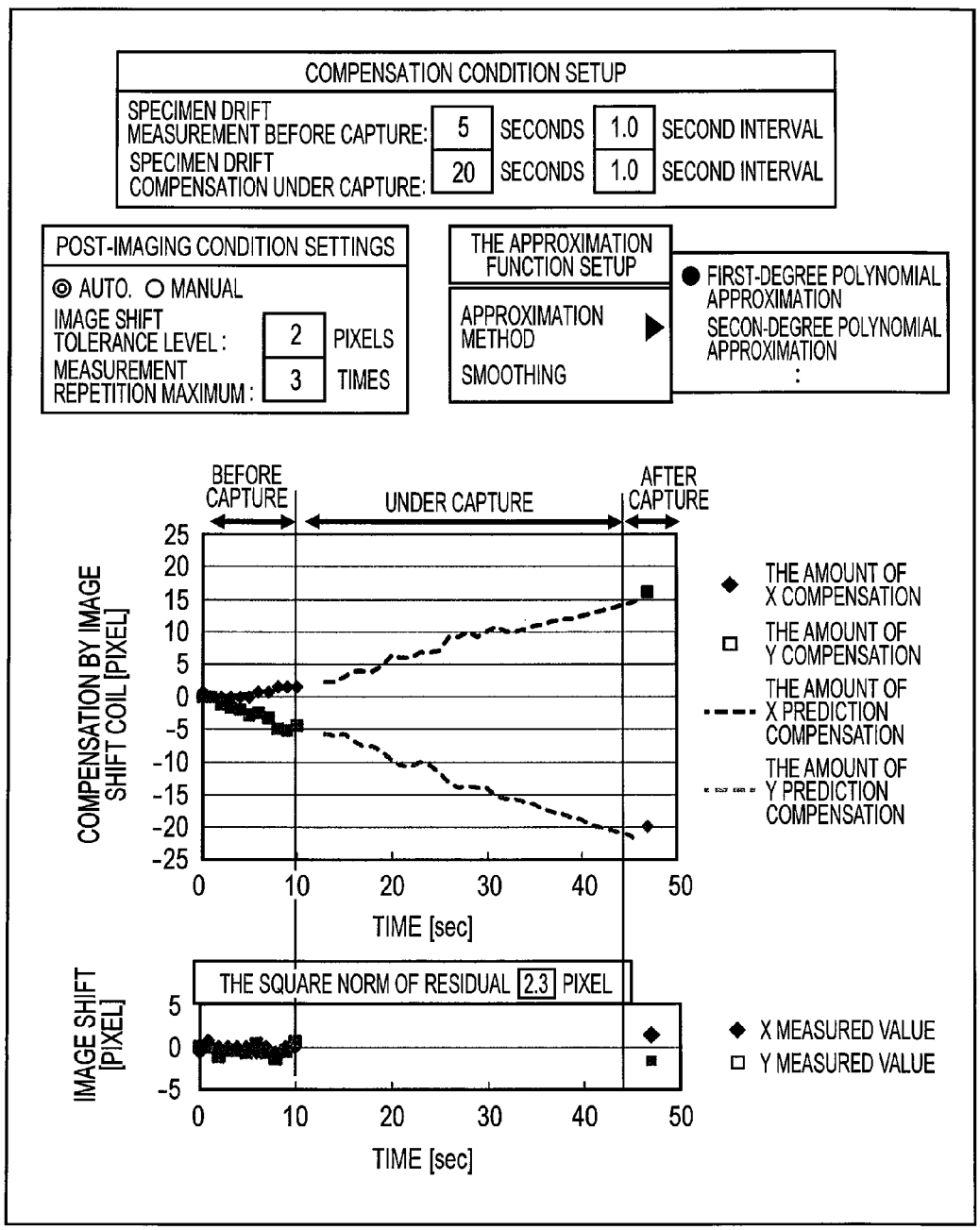
FIG. 10 illustrates one example of settings and a display screen for compensating for drift during imaging by an image shift deflector, which is used in Embodiment 2.

At last, a screen that displays the system control settings and processing results of Embodiment 2 is shown in FIG. 9. A checkbox for distortion compensation during image capture is added in the "flow selection" window in the screen shown in FIG. 1. Checking the checkbox opens a window shown in FIG. 10. On this window, the specimen drift compensation process during image capture by the image shift deflector is controlled and the compensation results are displayed. In a step (S5-1) where the specimen drift is measured by using the fast-scan images, an image captured at first is regarded as a reference image, an image subsequently captured is regarded as an input image, the image shift amount of the input image with respect to the reference image is obtained, and the image shift is compensated for by the image shift deflector. Since the image shift deflector allows the field of view of the image to track the specimen drift, the compensation locus created by the image shift deflector can be regarded as the locus of the specimen drift. The approximation function of the specimen drift during image capture is obtained from the locus (S5-2). On the window shown in FIG. 10, the selection of the approximation function is made and the conditions of drift measurement before image capture and drift compensation during image capture are set. Setting of the conditions required for after image capture starts with selection of whether to automatically or manually determine the necessity of capturing the images again. Selection of automatic determination is followed by input of image shift tolerance level and the maximum limit of repetitions to be performed. Under these conditions, it is determined whether the images need to be captured again based on the image shift amounts obtained after the images are captured (S5-5).

A combined use of the distortion compensation by the image shift deflector with Embodiment 1 increases time required for drift compensation by approximately 5 to 10 seconds, but improves the accuracy of distortion compensation. This is because blurring of the reference image is reduced and the image shift amount between the small domains of the reference image and small domains of the input image is reduced. The combined use is more effective for a large amount of specimen drift as generated immediately after the specimen stage stops.

Embodiment 3

Embodiment 3 shows an example in which the present invention is applied to an apparatus capable of providing multiple types of electric charged particle beams. The matters that are described in Embodiments 1 and 2, but not in Embodiment 3, should be considered as being included in Embodiment 3.

As with the case of Embodiments 1 and 2, Embodiment 3 also uses the same apparatus as shown in FIG. 7. The apparatus in FIG. 7 is equipped with a plurality of detectors: a detector 22-3 for detecting secondary electrons emitted backward from the specimen 30; an electron detector for bright-field images 22-1 for detecting low angle scattering electrons out of electron beams emitted forward from the specimen 30; and an electron detector for dark-field images 22-2 for detecting high angle scattering electrons out of electron beams emitted forward from the specimen 30. In addition, a transmitted electron beam can be split into elastically scattered electron beam 32-5 and inelastically scattered electron beam 32-6 by an electron energy-loss spectroscope 25 and an electron energy-loss spectroscope control unit 25' to measure the split beams. An X-ray generated from the specimen can be measured by an energy-dispersive X-ray spectroscope 24 and an energy-dispersive X-ray spectroscope control unit 24'. The energy-dispersive X-ray spectroscope 24 and electron energy-loss spectroscope 25 can analyze the composition of the specimen and chemical bond state of the specimen. If a scan signal of an incident beam and an output signal of the detectors are synthesized, various images can be simultaneously obtained.

The SNR, contrast and spatial resolution of the image vary according to the detectors to be used. Of course, the measurement accuracy of distortion improves more by using images of high SNR, high contrast and high resolution. Thus, a high quality image with a high SNR, high contrast and high resolution and a low quality image with a low SNR, low contrast and low resolution are simultaneously measured. Then, distortion is measured by using a high quality reference image and a high quality input image. The distortion measurement results are referred to form a compensated image from a low quality input image, thereby achieving highly-accurate distortion compensation even with low quality images.

More specifically, an elastically scattered electron beam image can be used as the high quality image, while an inelastically scattered electron beam image can be used as the low quality image. Because most of the transmitted electrons are inelastically scattered electrons, the elastically scattered electron beam image has a high SNR, and the inelastically scattered electron beam image, which is obtained by splitting an electron beam by the electron energy-loss spectroscope 25 and causing the electron beams to pass through slits to extract electron beams having a specific energy width, has a low SNR. Alternatively, it is also effective to use a low angle scattering electron beam image as the high quality image and a high angle scattering beam image as the low quality image. Since the low angle scattering electron beam image has enhanced diffraction contrast, while the high angle scattering beam image has a low diffraction contrast, the low angle scattering electron beam image is more preferable in that the image includes many feature points required for image processing.

In the flow of compensating for the specimen drift as described in Embodiment 2 (FIG. 8), the high quality image is used in the step (S5) of compensating for the specimen drift by an image shift deflector during image capture, the step (S1) of taking a reference image by a fast-scan mode, the step (S2) of taking an input image by a slow-scan mode, and the step (S3) of measuring the distortion of the input image with respect to the reference image. The differences in Embodiment 3 from Embodiment 2 lie in that a low quality slow-scan image as an input image is captured concurrently with a high quality image in step 2 and the distortion of the low quality input image is compensated for based on the measurement results obtained from the high quality input image in the distortion compensation of step 4. Measuring the distortion with the high quality images significantly improves the accuracy of the distortion compensation for the low quality images.

Embodiment 4

Figure 11:
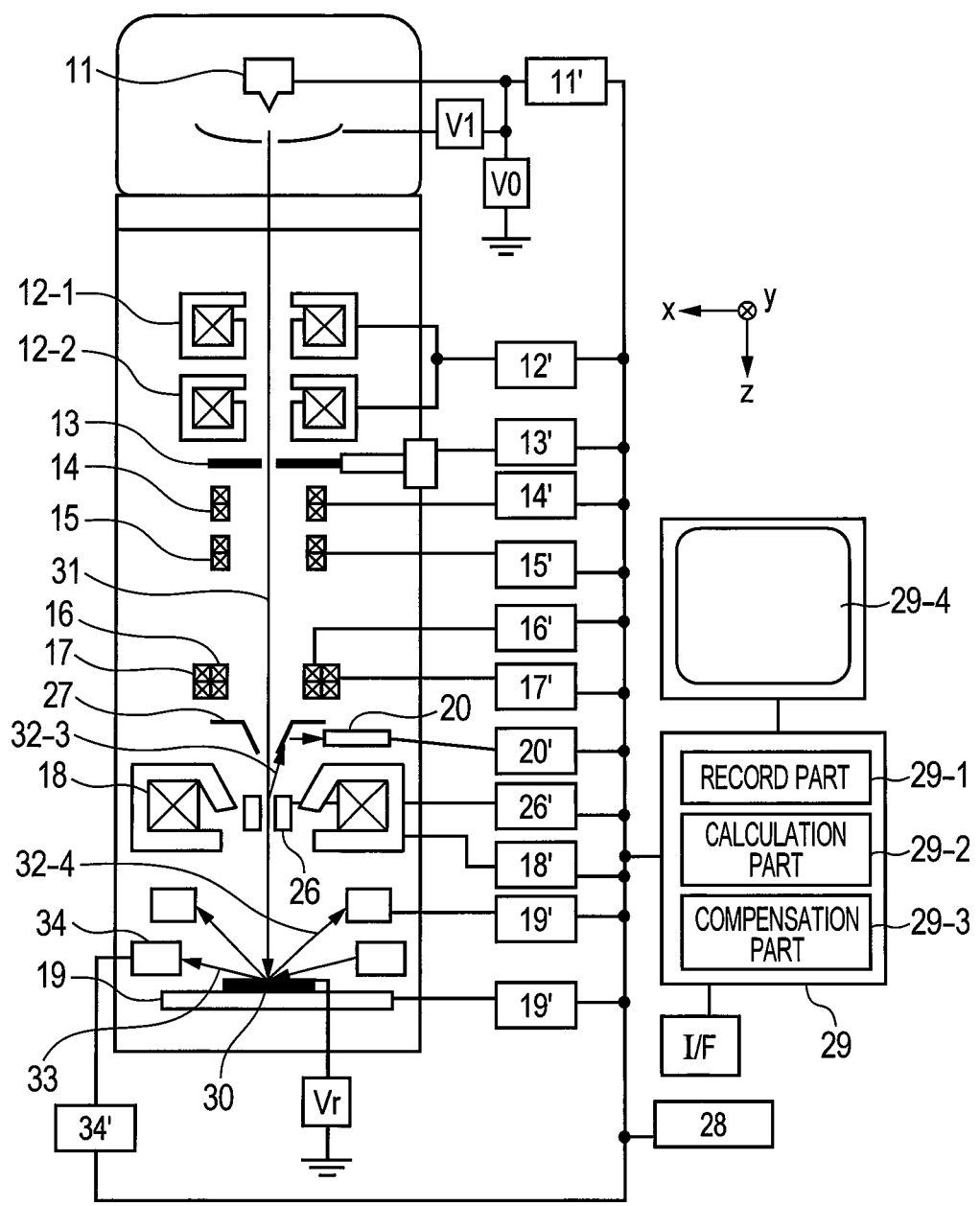
FIG. 11 is a schematic view showing a basic configuration of a SEM used in Embodiment 4.

Embodiment 4 shows an example in which the present invention is applied to an apparatus shown in FIG. 11. The matters that are described in Embodiments 1, 2 and 3, but not in Embodiment 4, should be considered as being included in Embodiment 4. The apparatus in FIG. 11 employs an image formation method utilizing a charging phenomenon called voltage contrast. The apparatus using the charging phenomenon tends to increase possibility of generating specimen drift caused by charge. Hence, a reference image is captured at a fast scan rate under conditions where the charging phenomenon is hard to occur, while an input image is captured at a slow scan rate under conditions where the charging phenomenon is easy to occur. The obtained fast scan image has a low voltage contrast that provides difficulty in observing defects, but contains a circuit pattern that is irrelevant to defects but observable without using the charging phenomenon. With the use of this circuit pattern, the distortion of the slow scan image with respect to the fast scan image is measured and compensated for. The distortion compensation results in reduction of false detection in a step of extracting defects by means of the differences between a non-defective item image and a defective item image. In addition, the defects can be also detected by using the image difference between the fast scan image and a compensated slow scan image.

REFERENCE SIGNS LIST

11: electron gun;
11': electron gun control unit;
12: condenser lens;
12': condenser lens control unit;
13: condenser aperture;
13' condenser aperture control unit;
14: alignment deflector;
14': alignment deflector control unit;
15: stigmator;
15' stigmator control unit;
16: image shift deflector;
16' image shift deflector control unit;
17: scanning deflector;
17': scanning deflector control unit;
18: objective lens;

18': objective lens control unit;
19: specimen stage;
19': specimen stage control unit;
20: projective lens;
20': projective lens control unit;
21: alignment deflector;
21': alignment deflector control unit;
22-1: electron detector for bright-field images;
22'-1: electron detector control unit for bright-field images;
22-2: electron detector for dark-field images;
22'-2: electron detector control unit for dark-field images;
22-3: secondary electron detector;
22'-3: secondary electron detector control unit;
22-4: backscattered electron detector;
22'-4: backscattered electron detector control unit;
23: scattering angle select aperture;
23': scattering angle select aperture control unit;
24: energy-dispersive X-ray spectroscope;
24': energy-dispersive X-ray spectroscope control unit;
25: electron energy-loss spectroscope;
25': electron energy-loss spectroscope control unit;
26: ExB deflector;
26': ExB deflector control unit;
27: converter electrode;
28: vision unit;
29: computer with control program and image processing program;
29-1: record part which records two or more images;
29-2: calculation part which asks for image distortion between images;
29-3: compensation part which creates a compensation image from an input image by using measured image distortion;
29-4: display part which displays the images, the calculation results, and the compensation results;
30: specimen;
31: primary electron beam;
32-1: low angle scattering electron;
32-2: high angle scattering electron;
32-3: secondary electron;
32-4: backscattered electron;
32-5: elastically scattered electron;
32-6: inelastically scattered electron;
33: laser beam;
34: height sensor with laser beam 33;
34': height sensor control unit

The invention claimed is:

1. An electric charged particle beam microscope comprising:
   an electric charged particle source;
   a condenser lens converging electric charged particles emitted from the electric charged particle source on a specimen;
   a deflector deflecting the converged electric charged particles to scan the specimen;
   a control unit of the deflector;
   a specimen stage on which the specimen is mounted;
   a detector detecting the electric charged particles;
   a computer forming an image from a control signal from the deflector and an output signal from the detector; and
   a display part connected with the computer, wherein
   the control unit of the deflector can change the scan rate of the electric charged particles,
   a first rate scan image is obtained at a first rate and a second rate scan image is obtained at a second rate slower than the first rate, and
   the electric charged particle beam microscope further comprises an analysis unit measuring the distortion of the second rate scan image by using the first rate scan image and compensating for the distortion.

2. The electric charged particle beam microscope according to claim 1, wherein
   the analysis unit divides the first rate scan image and the second rate scan image into small domains, respectively,
   the analysis unit measures image shift amounts between the small domains of the first rate scan image and the small domains of the second rate scan image by pattern matching, and
   the analysis unit determines the distortion from the distribution of the image shift amounts.

3. The electric charged particle beam microscope according to claim 1, wherein
   the analysis unit divides the first rate scan image and the second rate scan image into small domains, respectively,
   the analysis unit measures image shift amounts and correlative values between the small domains of the first rate scan image and the small domains of the second rate scan image by pattern matching,
   the analysis unit omits the image shift amount whose correlative value is equal to or lower than a threshold, and
   the omitted image shift amount is interpolated based on image shift amounts of small domains in the neighborhood of the small domain whose image shift amount is omitted.

4. An electric charged particle beam microscope comprising:
   an electric charged particle source;
   a condenser lens converging electric charged particles emitted from the electric charged particle source on a specimen;
   a deflector scanning the converged electric charged particles over the specimen;
   a control unit of the deflector;
   a specimen stage on which the specimen is mounted;
   a detector detecting the electric charged particles;
   a computer forming an image from a control signal from the deflector and an output signal from the detector; and
   a display part connected with the computer, wherein
   the control unit of the deflector can change the scan rate of the electric charged particles,
   a first rate scan image is obtained at a first rate and a second rate scan image is obtained at a second rate slower than the first rate, and
   the display part displays the distortion of the second rate scan image obtained by using the first rate scan image.

5. The electric charged particle beam microscope according to claim 4, wherein
   it can be determined whether the image distortion of the second rate scan image needs to be compensated for or not based on the image distortion.

6. The electric charged particle beam microscope according to claim 4, further comprising
   an analysis unit measuring and compensating for the distortion, wherein
   the analysis unit divides the first rate scan image and the second rate scan image into small domains, respectively,
   the analysis unit measures image shift amounts between the small domains of the first rate scan image and the small domains of the second rate scan image by pattern matching, and
   the analysis unit determines the distortion from the distribution of the image shift amounts.

7. The electric charged particle beam microscope according to claim 4, further comprising an analysis unit measuring and compensating for the distortion, wherein
the analysis unit divides the first rate scan image and the second rate scan image into small domains, respectively,
the analysis unit measures image shift amounts and correlative values between the small domains of the first rate scan image and small domains of the second rate scan image by pattern matching,
the analysis unit omits the image shift amount whose correlative value is equal to or lower than a threshold, and
the omitted image shift amount is interpolated based on image shift amounts of small domains in the neighborhood of the small domain whose image shift amount is omitted.

8. An electric charged particle beam microscopy that scans electric charged particles over a specimen and forms an image based on a secondary signal emitted from the specimen, comprising:
a first step of scanning at a first rate to form an image;
a second step of scanning at a second rate slower than the first rate to form an image;
a third step of measuring distortion of the second rate scan image by using the first rate scan image; and
a fourth step of compensating for the distortion of the second rate scan image based on the measured distortion.

9. The electric charged particle beam microscopy according to claim 8, wherein
the third step includes:
a step of dividing the first rate scan image and the second rate scan image into small domains, respectively;
a step of measuring image shift amounts between the small domains of the first rate scan image and small domains of the second rate scan image by pattern matching; and
a step of determining the distortion from the distribution of the image shift amounts.

10. The electric charged particle beam microscopy according to claim 8, wherein
the third step includes:
a step of dividing the first rate scan image and the second rate scan image into small domains, respectively;
a step of measuring image shift amounts and correlative values between the small domains of the first rate scan image and small domains of the second rate scan image by pattern matching;
a step of omitting the image shift amount whose correlative value is equal to or lower than a threshold; and
a step of interpolating the omitted image shift amount based on image shift amounts of small domains in the neighborhood of the small domain whose image shift amount is omitted.

* * * * *